(12) United States Patent
Ikeda et al.

(10) Patent No.: US 10,002,817 B2
(45) Date of Patent: Jun. 19, 2018

(54) SEMICONDUCTOR DEVICE

(71) Applicant: HITACHI POWER SEMICONDUCTOR DEVICE, LTD., Ibaraki (JP)

(72) Inventors: Osamu Ikeda, Tokyo (JP); Takayuki Kushima, Ibaraki (JP); Shinji Okubo, Ibaraki (JP); Takaaki Miyazaki, Tokyo (JP)

(73) Assignee: Hitachi Power Semiconductor Device, Ltd., Ibaraki (JP)

( * ) Notice: Subject to any disclaimer, the term of this patent is extended or adjusted under 35 U.S.C. 154(b) by 0 days. days.

(21) Appl. No.: 15/492,604

(22) Filed: Apr. 20, 2017

(65) Prior Publication Data

US 2018/0090412 A1     Mar. 29, 2018

(30) Foreign Application Priority Data

Sep. 26, 2016   (JP) .................... 2016-186537

(51) Int. Cl.
*H01L 23/367*     (2006.01)
*H01L 23/00*      (2006.01)
(Continued)

(52) U.S. Cl.
CPC .......... *H01L 23/3675* (2013.01); *H01L 23/15* (2013.01); *H01L 23/293* (2013.01);
(Continued)

(58) Field of Classification Search
CPC .......... H01L 23/49568; H01L 23/3114; H01L 23/3135; H01L 23/051; H01L 2224/73265;
(Continued)

(56) References Cited

U.S. PATENT DOCUMENTS 5,757,071 A * 5/1998 Bhansali ............. H01L 21/4853
                                                      257/697
6,201,696 B1 * 3/2001 Shimizu .................. H01L 23/24
                                                      165/80.2
(Continued)

FOREIGN PATENT DOCUMENTS

JP     2005-116602 A     4/2005

OTHER PUBLICATIONS

J. Chem. Software, vol. 3, No. 2, pp. 91-06 (1996), Embedded Atom Method, Surface Energy, Surface Reconstruction.

*Primary Examiner* — Latanya N Crawford
(74) *Attorney, Agent, or Firm* — Volpe and Koenig, P.C.

(57) ABSTRACT

A power module includes: a ceramic substrate that includes a principal surface and a back surface, and is provided with a plurality of metal wirings on the principal surface; a semiconductor chip mounted on any metal wiring of the plurality of metal wirings; and a resin part disposed around each of the plurality of metal wirings. Further, side faces of the metal wirings each have: a first region in which a plating film is formed; a second region that is positioned above the first region and that is a non-plating region; and a third region that is positioned between the first region and the second region and in which metal particles are formed. The resin part is bonded to the metal particles, the plating film, and the principal surface of the ceramic substrate.

20 Claims, 8 Drawing Sheets

(51) Int. Cl.
*H01L 23/29* (2006.01)
*H01L 23/15* (2006.01)
*H01L 23/373* (2006.01)

(52) U.S. Cl.
CPC .......... *H01L 23/3736* (2013.01); *H01L 24/46* (2013.01); *H01L 2224/45147* (2013.01); *H01L 2224/45655* (2013.01); *H01L 2224/48091* (2013.01); *H01L 2924/183* (2013.01)

(58) Field of Classification Search
CPC ... H01L 23/3675; H01L 23/15; H01L 23/293; H01L 24/46; H01L 23/3736; H01L 2224/45147; H01L 2224/45655; H01L 2924/183; H01L 2224/48091
See application file for complete search history.

(56) References Cited

U.S. PATENT DOCUMENTS

| | | | | |
|---|---|---|---|---|
| 2006/0214186 | A1* | 9/2006 | Hamidi | H01L 23/24 257/177 |
| 2013/0256856 | A1* | 10/2013 | Mahler | H01L 24/40 257/676 |
| 2014/0153238 | A1* | 6/2014 | Nishimura | H01L 25/0753 362/237 |
| 2014/0299982 | A1* | 10/2014 | Minamio | H01L 25/165 257/712 |
| 2015/0021750 | A1* | 1/2015 | Fujino | H01L 23/24 257/667 |
| 2016/0254218 | A1* | 9/2016 | Hong | H01L 21/561 257/773 |
| 2016/0343644 | A1* | 11/2016 | Kawashima | H01L 21/565 |

* cited by examiner

SEMICONDUCTOR DEVICE

CROSS-REFERENCE TO RELATED APPLICATION

The present application claims priority from Japanese Patent Application No. 2016-186537 filed on Sep. 26, 2016, the content of which is hereby incorporated by reference into this application.

TECHNICAL FIELD OF THE INVENTION

The present invention relates to a semiconductor device, and in particular relates to a power-type semiconductor device used for an inverter.

BACKGROUND OF THE INVENTION

Many of the power-type semiconductor devices (power modules) each have a structure in which a semiconductor element (hereinafter, referred to as "semiconductor chip" or simply "chip") and an insulating substrate, or the insulating substrate and a heat-radiative metal plate are bonded together with solder or the like.

So far, lead (Pb)-containing solder has been used as a connection member for a semiconductor device required to have high heat resistance, in particular for the semiconductor device used for fields of an automobile, a construction machine, a railroad, an information device, and the like. However, an apparatus using a lead-free connection member is also widely utilized for reducing an environmental load.

In recent years, prompted is development of a wide gap semiconductor that uses SiC and GaN and the like to be capable of operating with high temperature and reducing size and weight of the apparatus. Incidentally, whereas an upper limit of operation temperature of a silicon (Si) semiconductor element is 150 to 175° C. in general, a SiC semiconductor element can be used at 175° C. or higher. However, when working temperature is high, heat resistance of 175° C. or higher is required also for various members used in the semiconductor device (power module).

In addition, in order to reduce cost, a demand for high efficient and stable bonding processes is increasing. In the SiC power module, particularly, since the cost of the SiC element is higher than that of the Si element, a high robust process and a mounting structure for achieving the same are demanded.

Incidentally, Patent Document 1 (Japanese Patent Application Laid-open No. 2005-116602) discloses a structure that improves a discharge characteristic in a circuit board used at a high voltage and is used for the power module and the like.

SUMMARY OF THE INVENTION

In a high insulative power module having a withstand voltage specification of 10 kVmrs or higher, an electric field converges at each end portion of metal wirings on the insulating substrate due to a high voltage, and partial discharge easily occurs. Therefore, it is necessary to suppress the partial discharge by coating a resin having high dielectric breakdown strength on each longitudinal surface of the wirings. However, when the resin coating creeps up to an upper surface of each metal wiring, since it becomes impossible to bond a terminal(s) in a subsequent process, prevention of "resin creeping-up" is an important problem. As a countermeasure against the partial discharge, Patent Document 1 (Japanese Patent Application Laid-open No. 2005-116602) states as follows. It discloses that: the insulating substrate and the metal wiring (s) are bonded together via a bonding layer; all or a part of a surface of the insulating substrate from each end portion of the metal wirings are covered with a coating material; and a dielectric constant of the coating material is 3.0 to 10.0. Further, it discloses that: protruding length from each metal wiring on the bonding layer is set at 20 to 100 μm; a top of a wiring pattern has no protrusion; and an R size of an edge portion of the top of the wiring pattern is set at 10 to 100 μm, whereby the partial discharge can be prevented. However, a device for preventing the "resin creeping-up" as described above is not taken.

An object of the present invention is to provide a technique capable of achieving qualitative improvement and high efficient manufacture of the semiconductor device.

The above and other objects and novel characteristics of the present invention will be apparent from the description of the present specification and the accompanying drawings.

The following is a brief description of an outline of the typical invention disclosed in the present application.

A semiconductor device according to the present invention comprises: an insulating substrate that has a first surface and a second surface positioned opposite to the first surface, and is provided with a plurality of wiring parts on the first surface; a semiconductor chip mounted on any of the plurality of wiring parts; and a resin part disposed around each of the plurality of wiring parts. Further, a side face of any of the plurality of wiring parts includes a first region in which a plating film is formed, and a second region that is positioned in a direction away from the first surface of the insulating substrate from the first region and in which the plating film is not formed; and the resin part is bonded to the plating film and the first surface of the insulating substrate.

The effects obtained by typical embodiments of the invention disclosed in the present application will be briefly described below.

The qualitative improvement and high robust manufacture of the semiconductor device can be achieved.

DESCRIPTIONS OF THE PREFERRED EMBODIMENTS

First Embodiment

<Structure of Semiconductor Device>

Figure 1:
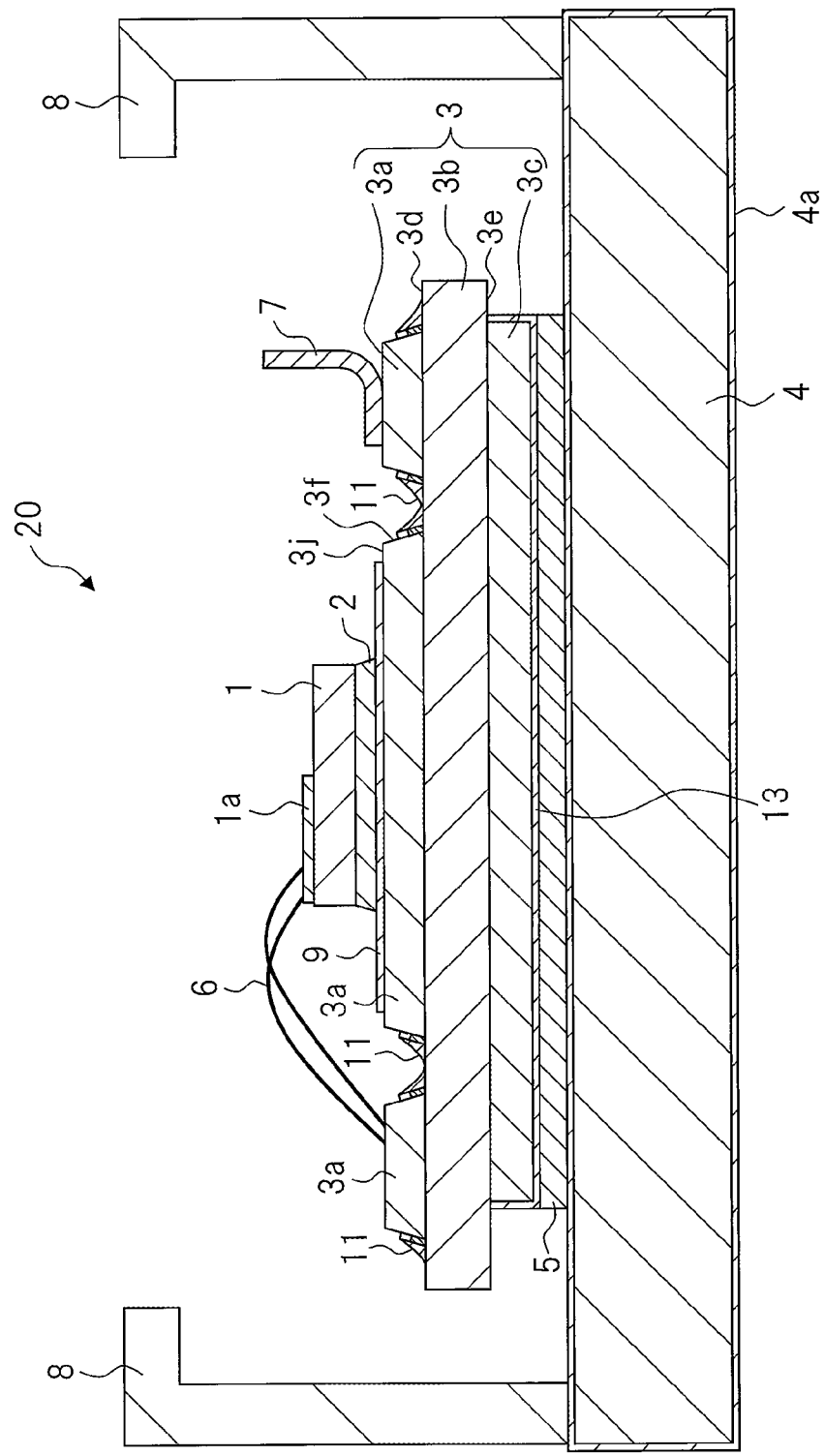
FIG. 1 is a sectional view illustrating an example of a structure of a semiconductor device (power module) according to a first embodiment of the present invention.
Figure 2:
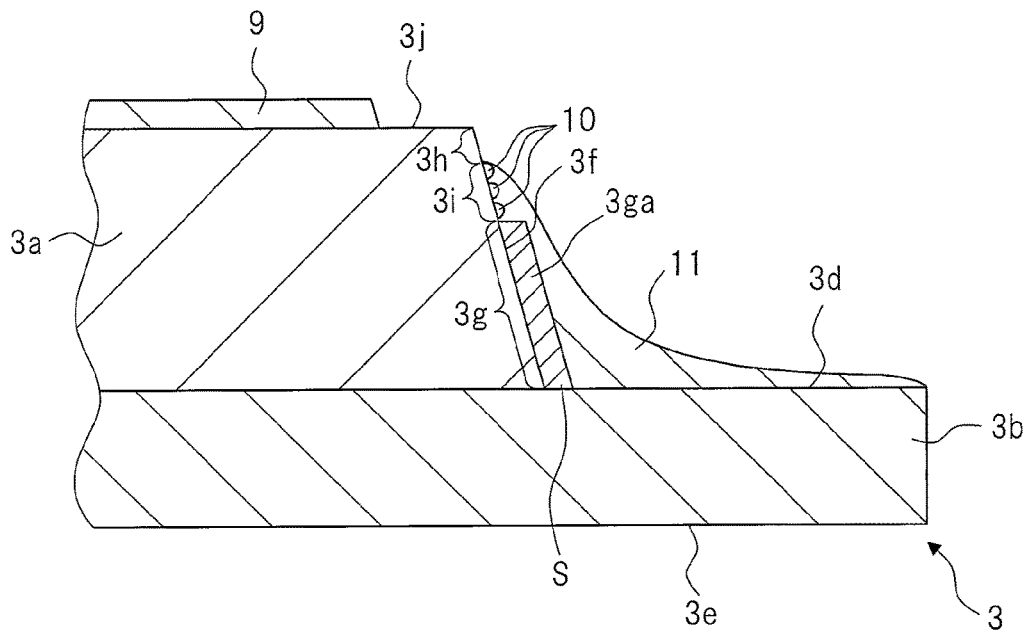
FIG. 2 is an enlarged partial sectional view illustrating an example of a structure of a side face of a wiring part and a resin part which are illustrated in FIG. 1.
Figure 3:
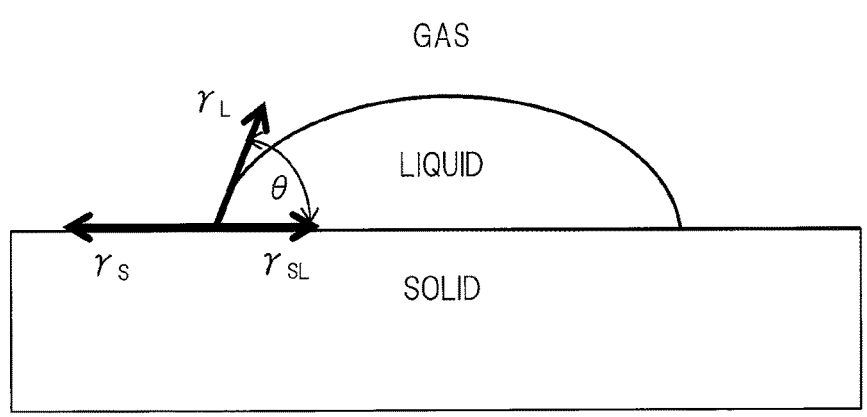
FIG. 3 is a schematic view of wetting for describing Young's equation in the present invention.

FIG. 1 is a sectional view illustrating an example of a structure of a semiconductor device (power module) according to a first embodiment of the present invention; FIG. 2 is an enlarged partial sectional view illustrating an example of a structure of a side face of a wiring part and a resin part which are illustrated in FIG. 1; and FIG. 3 is a schematic view of wetting for describing Young's equation in the present invention.

A semiconductor device according to the first embodiment is, for example, a semiconductor module (power module) mounted in a railroad vehicle, a body of an automobile, or the like. Therefore, the semiconductor device includes a plurality of power-type semiconductor chips (semiconductor elements) 1, and requires a countermeasure against resin creeping-up. Incidentally, each of the semiconductor chips 1 is, for example, an insulated gate bipolar transistor (IGBT), a metal oxide semiconductor field effect transistor (MOSFET), or a diode, but is not limited to them.

Description will be made with reference to a power module 20 illustrated in FIG. 1. The power module 20 has: a ceramic substrate (insulating substrate) 3 for supporting the semiconductor chip 1; a plurality of conductive wires 6 each electrically connecting an electrode 1a formed on an upper surface of the semiconductor chip 1 and a metal wiring (wiring part) 3a on the ceramic substrate 3; and a plurality of terminals (leads) 7 that is drawn outside.

In addition, the ceramic substrate 3 on which the plurality of semiconductor chips 1 and the plurality of terminals 7 are mounted includes a principal surface (first surface) 3d, and a back surface (second surface) 3e positioned at an opposite side to the principal surface 3d, and the principal surface 3d is provided with a plurality of metal wirings (wiring parts) 3a. Then, the semiconductor chip 1 is mounted on any metal wiring 3a of the plurality of metal wirings 3a via solder (bonding material, solder alloy) 2 and, further, a resin part 11 is disposed around each of the plurality of metal wirings 3a.

Incidentally, the ceramic substrate 3 is mounted on a base plate (metal plate) 4 via solder (bonding material, solder alloy) 5. That is, the base plate 4 supports the ceramic substrate 3 via the solder 5. In the ceramic substrate 3, the plurality of metal wirings 3a is formed on the principal surface 3d, whereas a metal wiring 3c is formed on the back surface 3e. That is, the ceramic substrate 3 includes a ceramic 3b, and the metal wirings 3a and 3c respectively provided on both sides of the ceramic 3b. These metal wirings 3a and 3c are each made from, for example, Cu or Al, or a laminated composite material of Cu and Al. Further, plating 9 is formed on a portion to which the solder 2 of the metal wiring 3a on the principal surface 3d side is connected. Meanwhile, plating 13 is formed on a surface of the metal wiring 3c on the back surface 3e. Incidentally, the principal surface 3d of the ceramic substrate 3 means an upper surface of the ceramic 3b, whereas the back surface 3e of the ceramic substrate 3 is a lower surface of the ceramic 3b.

One end of the terminal 7 is bonded to the metal wiring 3a on the principal surface 3d of the ceramic substrate 3, and the other end is drawn outside a case 8. The base plate 4 is a heat-radiative metal plate such as a Cu plate, or a composite material of metal and ceramic, and its surface is covered with a Ni plating film 4a.

In addition, each of the plurality of wires 6 is, for example, an Al wire or a Cu wire.

Here, the "resin creeping-up" studied by the inventors of the present application will be described.

Figure 10:
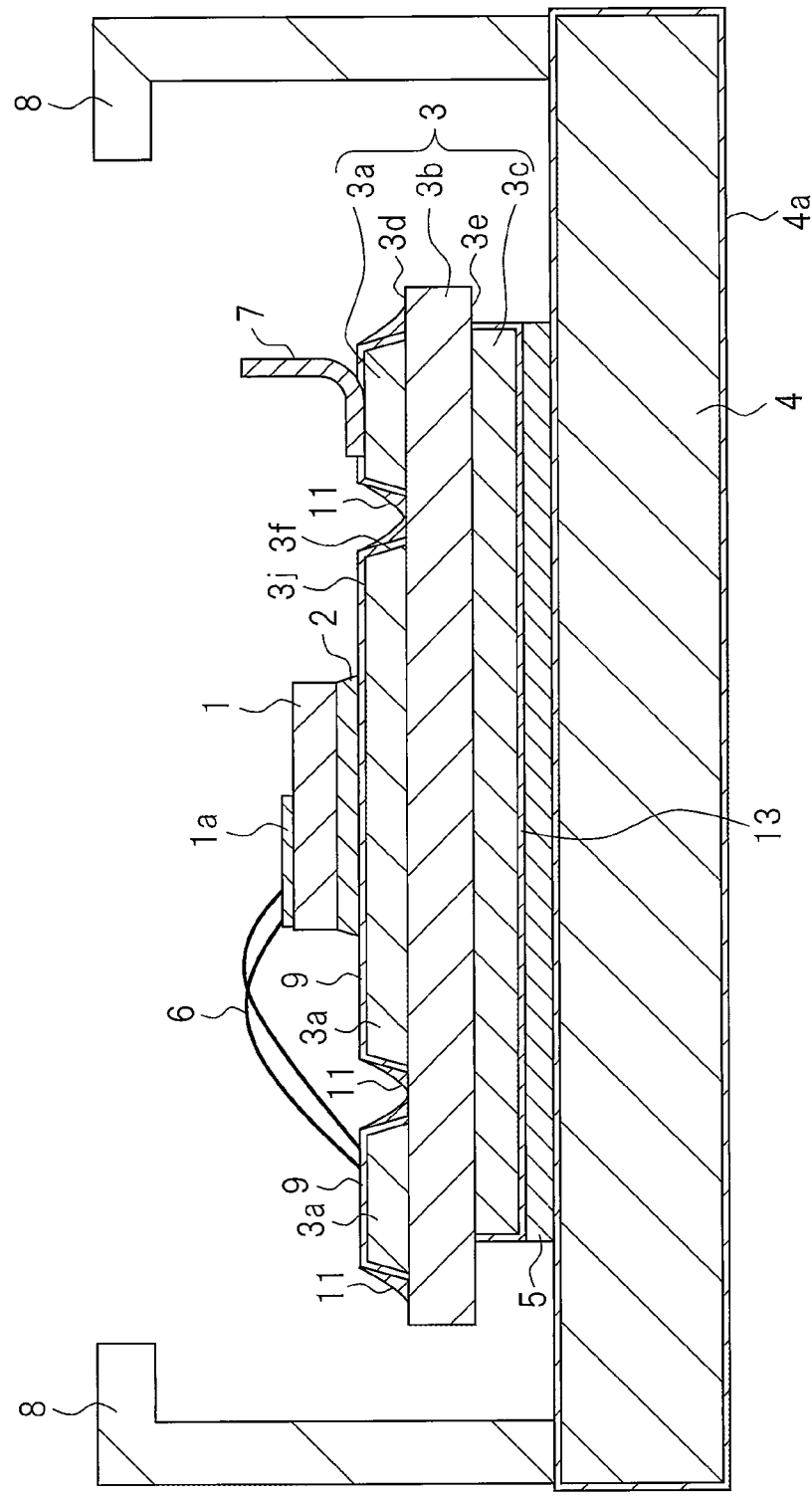
FIG. 10 is a sectional view illustrating a structure of a semiconductor device (power module) of a comparative example.
Figure 11:
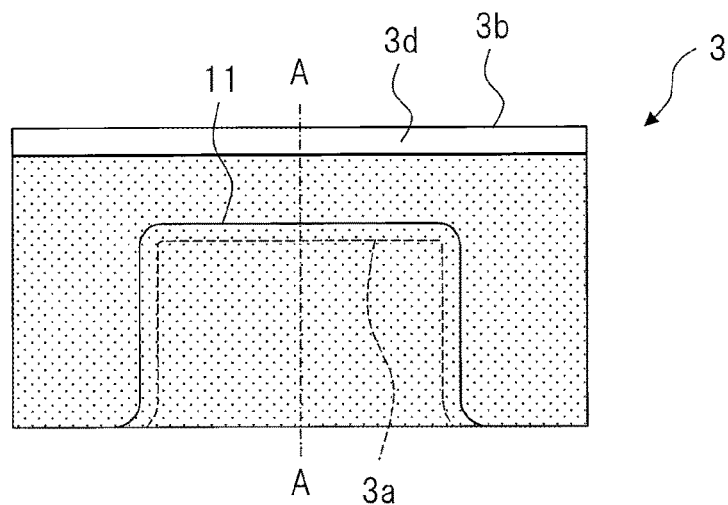
FIG. 11 is an enlarged partial plan view illustrating the structure of the wiring part illustrated in the comparative example of FIG. 10.
Figure 12:
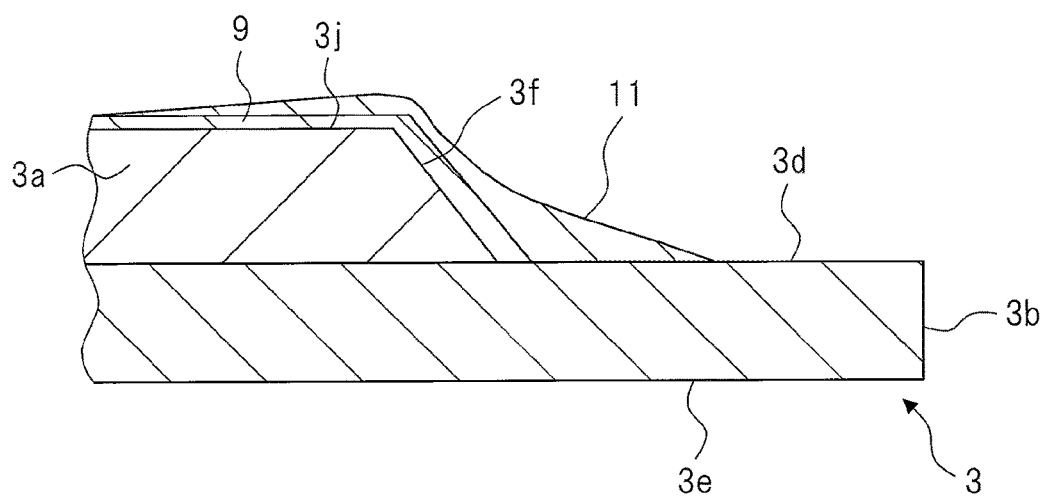
FIG. 12 is an enlarged partial sectional view illustrating a structure taken along line A-A of FIG. 11.

The "resin creeping-up" is caused by the fact that resin contiguously wets and spreads on side faces 3f of the metal wiring 3a when the resin forming the resin part 11 is applied on the side faces 3f of the metal wiring 3a and on the ceramic substrate 3, as illustrated in comparative views of FIG. 10 to FIG. 12. In the power module illustrated in FIG. 10, the plating 9 and the plating 13 of Ni or the like are formed on the entire surfaces of the metal wirings 3a and 3c. As illustrated in FIG. 11 and FIG. 12, in a case of the power module not having a non-plating region on the side face 3f of the metal wiring 3a, the resin coating onto a longitudinal surface of the metal wiring 3a in the ceramic substrate 3 causes the resin to creep up from the side faces 3f of the metal wiring 3a. Therefore, there arises a problem in which the resin reaches a terminal bonding portion of the upper surface 3j of the metal wiring 3a.

Incidentally, the phenomenon of wetting is generally expressed by a relational expression called Young's equation, $\gamma_s = \gamma_{sL} + \gamma_L \cos \theta$, according to the schematic view of FIG. 3. Here, $\gamma_s$ is surface tension (surface energy) of solid; $\gamma_{sL}$ is interfacial tension between solid and liquid; and $\gamma_L$ is surface tension of liquid. Additionally, wetting and spreading of liquid tend to occur as the surface tension (surface energy: $\gamma_s$) of solid is larger.

Therefore, the inventors of the present application have considered: providing a region having no plating locally on the side face 3f as illustrated in FIG. 2 instead of making a surface state of the side face 3f of the metal wiring 3a uniform; and changing a degree of ease of wetting and spreading of the resin to control the "resin creeping-up". Further, the inventors of the present application have studied about a structure of the power module capable of preventing the "resin creeping-up", and found that the "resin creeping-up" can be prevented by providing the region having no plating, the region being near the upper part of the side face 3f of the metal wiring 3a and on the metal wiring 3a provided on a chip mounting side of the insulating substrate.

In the power module 20 of the first embodiment, the region having no plating is provided near the uppermost part of the side face 3f of the metal wiring 3a formed on the principal surface 3d of the ceramic substrate 3, as illustrated in FIG. 2. That is, the side face 3f of the metal wiring 3a includes a first region 3g on which a plating film 3ga is formed, and a second region 3h that is positioned above (in a direction away from the principal surface 3d of the ceramic substrate 3) the first region 3g and in which the plating film 3ga is not formed. The resin part 11 is bonded to the plating film 3ga and the principal surface 3d of the ceramic substrate 3 without being bonded to the second region 3h.

Further, on the side face 3f, a third region 3i having a metal uneven part including unevenness made of metal is formed between the first region 3g and the second region 3h. The metal uneven part is, for example, an uneven part formed of metal particles 10. Therefore, the side face 3f includes the first region 3g and the third region 3i in order from the principal surface 3d side, and further includes the second region 3h above the third region 3i, that is, on the uppermost part. The plating film 3ga is formed in the first region 3g, and the metal particles 10 are formed in the third region 3i. The second region 3h is a non-plating region, in which nothing is formed. In this case, the resin forming the resin part 11 wets the plating film 3ga and the metal particles 10. In addition, since the metal uneven part including a plurality of the metal particles 10 is a region having a large surface area, the wetting and spreading of the resin can be kept/stopped in the third region 3i, and the resin does not reach (or hard to reach) the second region 3h that is the uppermost non-plating region. Therefore, the resin part 11 is bonded to the metal particles 10, the plating film 3ga, and the principal surface 3d of the ceramic substrate 3.

In detail, the plating film 3ga is formed as partial plating on a portion (first region 3g) lower than (below) the vicinity of the uppermost part of the side face 3f of the metal wiring 3a on the principal surface 3d side (chip mounting side), and a region (third region 3i) on which the plurality of metal particles 10 adhere is provided at a position above the plating film 3ga. Thus, coated with the resin is a range from a peripheral portion of the principal surface 3d of the ceramic substrate 3 to the third region 3i into which the metal particles 10 adhere, and the resin part 11 is formed in the range. At this time, a base material of the metal wiring 3a in the second region 3h that is the non-plating region is necessary to be a metal that has the above-described surface energy smaller than that of the plating film 3ga and has difficulty in wetting and spreading. Thus, it is possible to cause the resin to wet and spread preferentially on the plating film 3ga, and it is possible to suppress wetting and spreading of the resin to the uppermost part (second region 3h) in the side face 3f since the non-plating region (second region 3h) is less wettable than the first region 3g of the plating film 3ga.

Incidentally, the first region 3g on which the plating film 3ga is formed preferably has a larger area than the third region 3i into which the metal particles 10 adhere. Due to the fact that the first region 3g has a larger area than the third region 3i, it is possible to achieve the wetting and creeping-up of the resin so that withstand voltage can be secured, and a thickness of the resin part 11 can be secured.

In addition, at least the first region 3g and the second region 3h are preferably formed on each of the side faces 3f of all the metal wirings 3a of the plurality of metal wirings 3a formed on the principal surface 3d of the ceramic substrate 3. Thus, the resin creeping-up along the side faces 3f of all the metal wirings 3a can be suppressed.

Here, a structure of the side face 3f of the metal wiring 3a according to the first embodiment will be specifically described further.

In the power module 20 of the first embodiment, the plating 9 that is a metal different from the base material of the metal wiring 3a is formed on the solder bonding portion of the metal wiring 3a on the ceramic substrate 3 illustrated in FIG. 1. In the power module 20, since the bonding portion has a high temperature due to heat generated by the semiconductor chip 1, the metal wirings 3a and 3c on the ceramic substrate 3 uses the Ni-based plating 9, 13, and plating film 3ga such as Ni or Ni—P that is less likely to be oxidized than Cu or Al even in an oxidizing atmosphere. According to Non Patent Document 1 (J. Chem. Software, Vol. 3, No. 2, pp. 91-96 (1996)), since the surface energy of Ni is 2380 erg/cm$^2$ which is larger among metallic materials, the wetting and spreading of the resin tend to occur easily. On the other hand, the surface energy of Cu or Al used as the base material of the metal wirings 3a and 3c of the ceramic substrate 3 is small as shown by 1790 erg/cm$^2$ for Cu and 1140/cm$^2$ for Al, the resin has difficulty in wetting and spreading. Therefore, as illustrated in FIG. 2, the second region 3h that is the non-plating region is provided near the uppermost part of the side face 3f of the metal wiring 3a, whereby the resin preferentially wets and spreads on the Ni plating portion (plating film 3ga), and it is possible to suppress the wetting and spreading of the resin onto Cu or Al (upper surface 3j of the metal wiring 3a).

In addition, on a position (third region 3i) between the first region 3g on which the plating film 3ga is formed and the second region 3h that is the non-plating region, the metal uneven part that has a larger surface area than that of a flat surface is formed. As an example, the metal uneven part is a region on which the metal particles 10 adhere, and an average particle size is preferably 20 µm or less since the surface area per unit volume decreases as the particle size increases. When a size of unevenness of the metal uneven part is 100 µm or less, a sufficient effect can be obtained. However, there is no particular problem even when the size is greater than 100 µm. That is, the metal uneven part causes the resin to be kept/stopped so that the resin does not creep up above a contact portion between the resin and the metal by using the unevenness to increase the surface area. Incidentally, the metal wiring 3a includes, for example, an alloy containing Cu as a main component; the plating 9, 13 and the plating film 3ga are Ni-based plating films; and a material of the metal particles 10 is, for example, Ni particles, Cu particles, or Ag particles. Here, during formation of the plating film 3ga that is partial plating by electroless plating when the plating film 3ga is a Ni-based plating film and the metal particles 10 are also Ni particles, the metal particles 10 can be formed on the third region 3i of the side face 3f by the same process.

In addition, by adopting Cu particles or Ag particles as the metal particles 10, an effect of trapping the resin creeping-up can be increased since the Cu particles or the Ag particles have less wettability to the resin than the Ni particles.

In addition, the plating film 3ga is the partial plating formed on the side face 3f, but is preferably formed to be in contact with the principal surface 3d of the ceramic substrate 3 as illustrated in FIG. 2. Incidentally, the plating film 3ga is not necessarily formed at a position indicated by an S portion of FIG. 2. However, if the plating film 3ga is not formed at the S portion, it is necessary to perform electroless plating in a state in which the S portion is masked, and the number of processes of plating formation increases. Therefore, the number of masks to be used in the electroless plating is preferably reduced, and the plating film 3ga is preferably in contact with the principal surface 3d of the ceramic substrate 3.

In addition, in the power module 20 illustrated in FIG. 1, the semiconductor chip 1 is mounted on the ceramic substrate 3 via the solder 2, and the ceramic substrate 3 is mounted on the base plate 4 via the solder 5. Here, each of the solder 2 and the solder 5 is preferably a solder alloy containing Sn as a main component, or a solder alloy containing Pb as a main component and, for example, is a solder alloy such as Pb—Sn, Sn—Cu, Sn—Cu—Sn, Sn—Sb, or Sn—Ag—Cu. Alternatively, it may be a bonding material such as Zn—Al, Au—Ge, or Au—Si. In addition, the solder 2 and the solder 5 may be different bonding materials. For example, such porous sintered metal as Ag, Au, or Cu may be used instead of the solder 2.

Incidentally, it is preferable to use, on the base plate 4, a Cu plate, an AlSiC plate, or a MgSiC plate having a Ni-based plating film at least at a bonding position to the solder 5. In the power module 20 illustrated in FIG. 1, illustrated as the base plate 4 is a structure in which the entire base plate 4 is covered with a Ni-based plating film.

In addition, in the power module 20, a polyimide-imide-based resin having high dielectric breakdown strength is preferably adopted as a resin forming the resin part 11. Thus, sufficient withstand voltage can be secured with the resin part 11 even in the power module 20 that requires large withstand voltage.

As described above, according to the power module 20 of the first embodiment, onto the side face 3f of the metal wiring 3a and the principal surface 3d of the ceramic substrate 3, the resin that is supplied during the resin coating and forms the resin part 11 preferentially wets and spreads on the plating film 3ga having the larger surface energy than that of the base material of the metal wiring 3a, and does not easily wet or spread on the second region 3h near the uppermost part that is the non-plating region. In addition, within the third region 3i between the first region 3g of the plating film 3ga and the second region 3h that is the non-plating region, the area in which the resin wets in contact with the metal uneven part (metal particles 10) can be increased, so that a flow of the resin can be suppressed in the third region 3i on which the metal uneven part is formed.

Thus, the resin creeping-up on the side face 3f of the metal wiring 3a can be suppressed. Incidentally, on the upper surface 3j of the metal wiring 3a, for example, the semiconductor chip 1, the terminal 7, or a chip component (not illustrated) is mounted via the Plating 9. But, when the resin creeps up the upper surface 3j of the metal wiring 3a, the semiconductor chip 1, the terminal 7, or the chip component causes connection failure, and a yield of the semiconductor device is decreased.

Therefore, the yield of the power module (semiconductor device) 20 can be improved by suppressing the resin creeping-up similarly to the power module 20 of the first embodiment. Further, the qualitative improvement and high efficient manufacture of the power module (semiconductor device) 20 can be achieved by suppressing the resin creeping-up.

In addition, the high robust manufacture of the power module (semiconductor device) 20 can be achieved.

<Modification>

Figure 4:
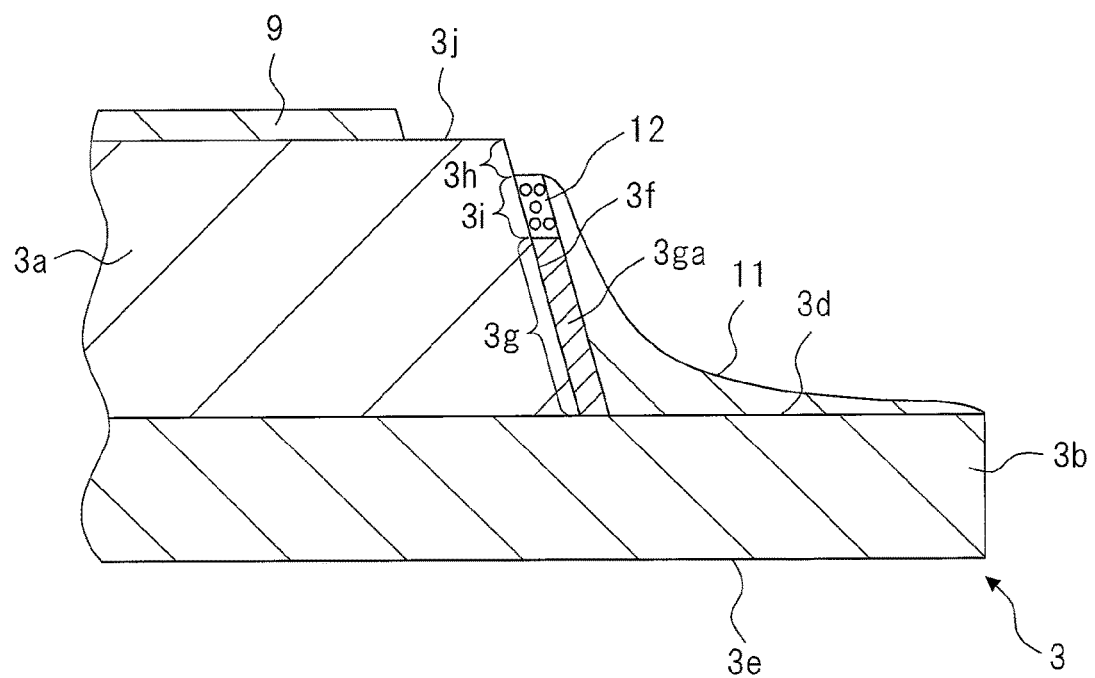
FIG. 4 is an enlarged partial sectional view illustrating a structure of a side face of a wiring part and a resin part in a modification.

FIG. 4 is an enlarged partial sectional view illustrating a structure of a side face of a wiring part and a resin part of a modification.

In the structure illustrated in FIG. 4, a porous metal film 12 that includes a metal film with a porous characteristic is formed as the metal uneven part in the third region 3i on the side face 3f of the metal wiring 3a. That is, a metal film of a porous structure (porous metal film 12) is formed in the third region 3i on the side face 3f of the metal wiring 3a, and unevenness due to porousness is formed on a surface of the metal film.

This porous metal film 12 contains, for example, Ni, Cu, or Al as a material, and can be formed by coating a paste material in which particles of Ni, Cu, Al or the like and a solvent are mixed together, and by sintering and solidifying the paste material. Since the unevenness due to the porousness is formed on the surface of the porous metal film 12, the surface area of the porous metal film can be made larger than that of another metal film whose surface is formed to be flat.

Thus, within the third region 3i between the first region 3g of the plating film 3ga and the second region 3h that is the non-plating region, the area in which the resin wets in contact with the porous metal film (metal uneven part) 12 can be made larger, so that the flow of the resin can be suppressed in the third region 3i on which the porous metal film 12 is formed.

As a result, the resin creeping-up along the side face 3f of the metal wiring 3a can be suppressed also in the modification.

Second Embodiment

Figure 5:
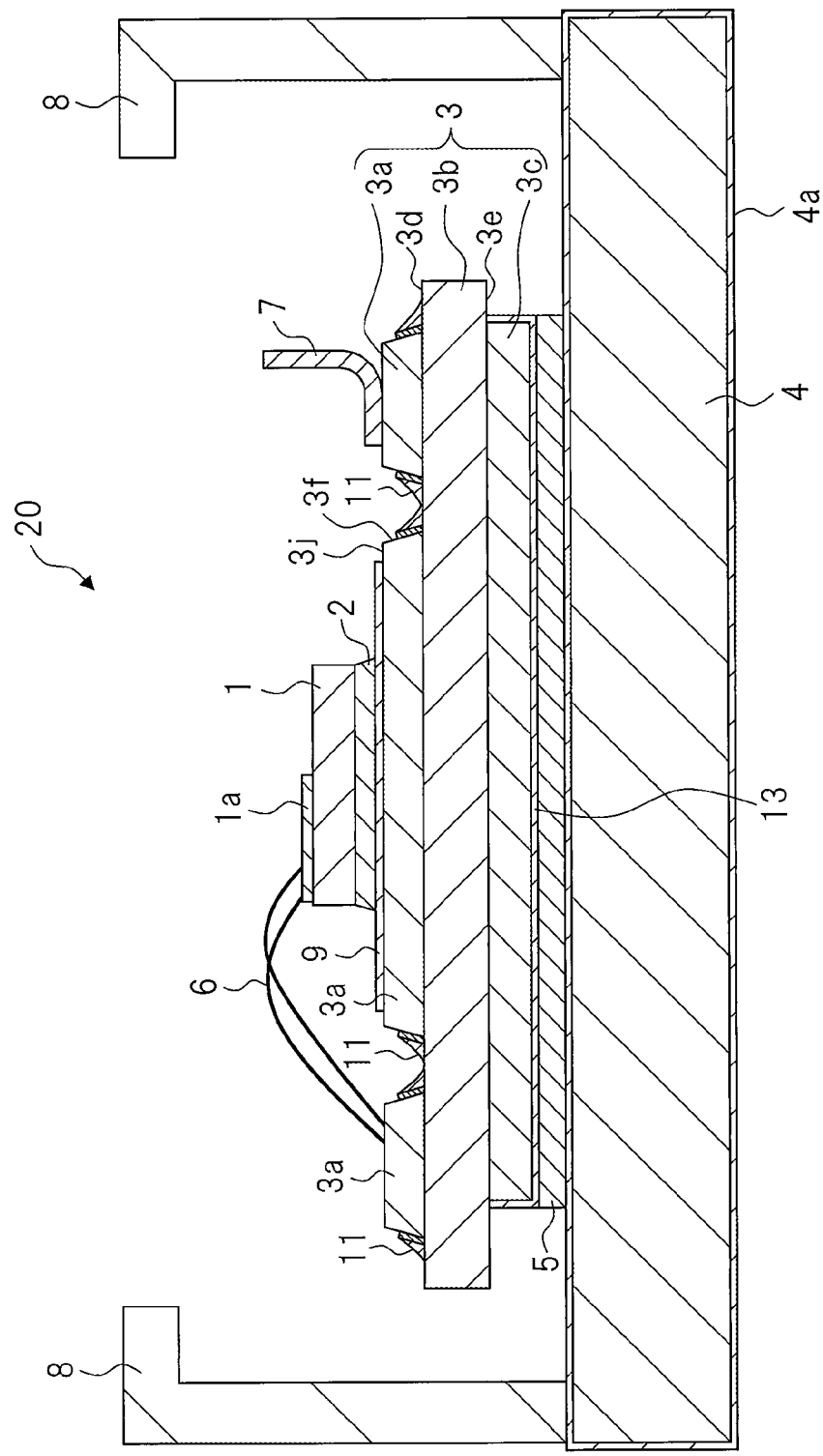
FIG. 5 is a sectional view illustrating an example of a structure of a semiconductor device (power module) according to a second embodiment of the present invention.
Figure 6:
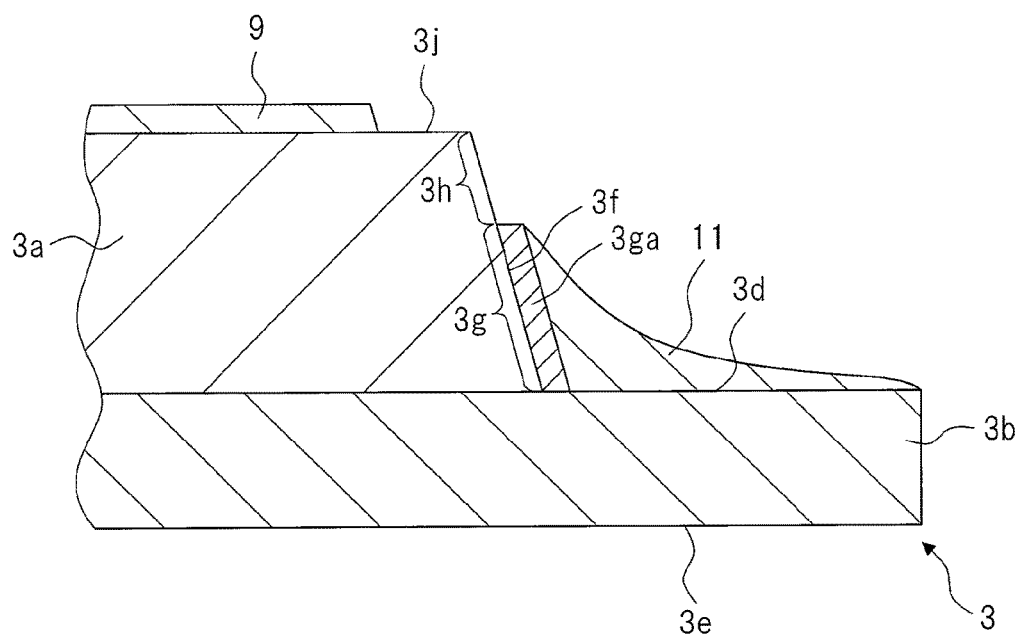
FIG. 6 is an enlarged partial sectional view illustrating an example of a structure of the side face of the wiring part and the resin part as illustrated in FIG. 5.

FIG. 5 is a sectional view illustrating an example of a structure of a semiconductor device (power module) according to a second embodiment of the present invention; and FIG. 6 is an enlarged partial sectional view illustrating an example of a structure of the resin part and the side face of the wiring part illustrated in FIG. 5.

A semiconductor device of the second embodiment illustrated in FIG. 5 is a semiconductor device having a structure substantially the same as that of the power module 20 described in the first embodiment. Therefore, similarly to the first embodiment, it a semiconductor module (power module) mounted in a railroad vehicle, a body of an automobile, or the like, and includes a plurality of power-type semiconductor chips 1. Each of the semiconductor chips 1 is, for example, an IGBT, a MOSFET, or a diode, but is not limited to them.

A structure of a power module 20 of the second embodiment will be explained. The structure has: a ceramic substrate 3 for supporting the semiconductor chip 1; a plurality of conductive wires 6 each electrically connecting an electrode 1a formed on an upper surface of the semiconductor chip 1 and a metal wiring 3a on the ceramic substrate 3; and a plurality of terminals 7 that are drawn outside.

Further, the ceramic substrate 3 on which the plurality of semiconductor chips 1 and the plurality of terminals 7 are mounted includes a principal surface 3d and a back surface 3e, and the principal surface 3d is provided with a plurality of metal wirings 3a. The semiconductor chip 1 is mounted on any metal wiring 3a of the plurality of metal wirings 3a via solder (bonding material, solder alloy) 2 and, further, a resin part 11 is disposed around each of the plurality of metal wirings 3a.

In addition, the ceramic substrate 3 is mounted on a base plate 4 via solder (bonding material, solder alloy) 5. That is, the base plate 4 supports the ceramic substrate 3 via the solder 5. On the ceramic substrate 3, the plurality of metal wirings 3a are formed on the principal surface 3d, whereas a metal wiring 3c is formed on the back surface 3e.

The power module 20 of the second embodiment is different from the power module 20 of the first embodiment in that, as illustrated in FIG. 6, only a second region 3h as a non-plating region is formed directly above a first region 3g in which a plating film 3ga as partial plating on the side face 3f of the metal wiring 3a is formed, and that the side face 3f does not have a third region 3i with a metal uneven part as illustrated in FIG. 2.

That is, in the power module 20 of the second embodiment, although the partial plating including Ni or the like is formed on the side face 3f of the metal wiring 3a, the side face 3f does not have a region, in which the metal uneven part is formed, directly above the first region 3g in which the partial plating is formed, but has only the second region 3h as a non-plating region. The resin forming the resin part 11 wets and spreads on the plating film 3ga, but does not wet or spread on the second region 3h that is a non-plating region. Thus, the resin is bonded to the first region, in which the plating film 3ga is formed, and the principal surface 3d of the ceramic substrate 3.

Therefore, it is possible to prevent the resin from creeping up until the upper surface 3j of the metal wiring 3a also in the power module 20 of the second embodiment.

From the above, also in the power module 20 of the second embodiment, similarly to the case of the power module 20 of the first embodiment, the yield of the power module 20 can be improved by suppressing the resin creeping-up. In addition, the qualitative improvement and the high efficient manufacture of the power module 20 of the second embodiment can be achieved by suppressing the resin creeping-up.

Further, the high robust manufacture of the power module 20 can be achieved.

Application Example

Figure 7:
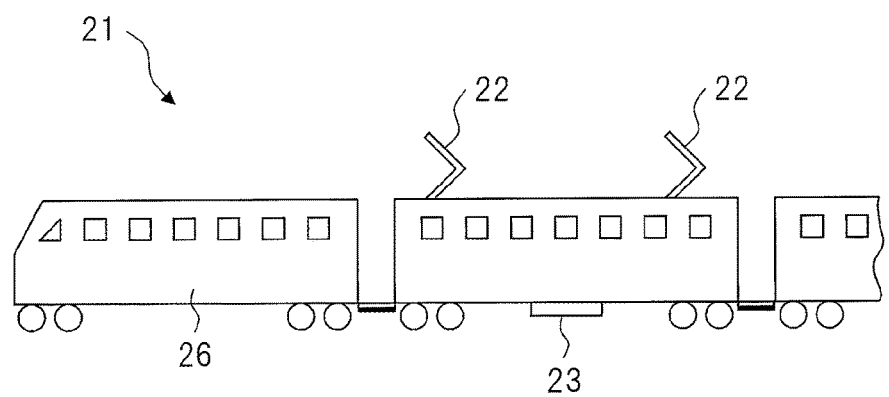
FIG. 7 is a partial side view illustrating an example of a railroad vehicle in which the semiconductor device illustrated in FIG. 1 is mounted.
Figure 8:
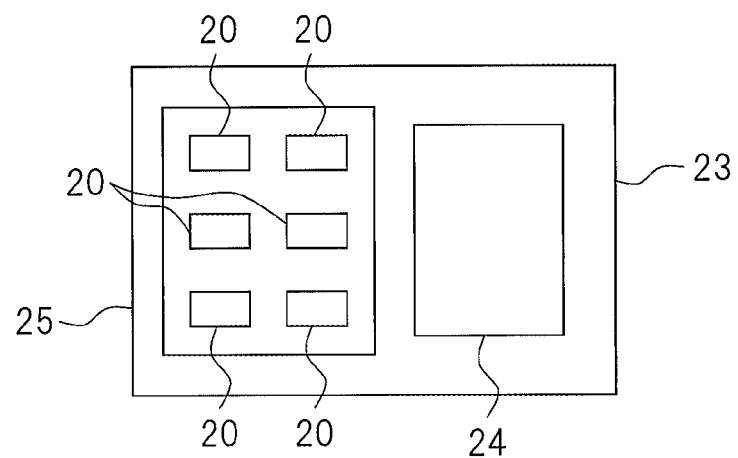
FIG. 8 is a plan view illustrating an example of an internal structure of an inverter installed in the railroad vehicle illustrated in FIG. 7.

FIG. 7 is a partial side view illustrating an example of a railroad vehicle in which the semiconductor device illustrated in FIG. 1 is mounted; and FIG. 8 is a plan view illustrating an example of an internal structure of an inverter installed in the railroad vehicle illustrated in FIG. 7.

In a present application example, a description will be made of a railroad vehicle in which the power module 20 of the first or second embodiment is mounted. A railroad vehicle 21 illustrated in FIG. 7 mounts, for example, the power module 20 illustrated in FIG. 1, and includes: a vehicle body 26; the power module 20 of FIG. 1; a mounting member for supporting the power module 20; a pantograph 22 that is a current collector; and an inverter 23. The power module 20 is mounted on the inverter 23 installed on a lower part of the vehicle body 26.

As illustrated in FIG. 8, inside the inverter 23, a plurality of power modules 20 are mounted on a printed circuit board (mounting member) 25 and, further, a cooling device 24 for cooling these power modules 20 is mounted. In each of the power modules 20 of the first and second embodiments illustrated in FIG. 1, a large amount of heat is generated from the semiconductor chip 1. Therefore, the cooling device 24 is attached to be capable of cooling an interior of the inverter 23 by cooling the plurality of power modules 20.

Thus, provided in the railroad vehicle 21 is the inverter 23 on which the plurality of power modules 20 each using a bonding structure of the module illustrated in FIG. 1 are mounted. Therefore, reliability of the inverter 23 and the railroad vehicle 21 in which the inverter 23 is provided can be improved even when the interior of the inverter 23 is a high temperature environment. That is, it is possible to achieve the power module 20 and an inverter system using the power module 20 that have operative stability under the high temperature environment and that can endure a large current load.

Figure 9:
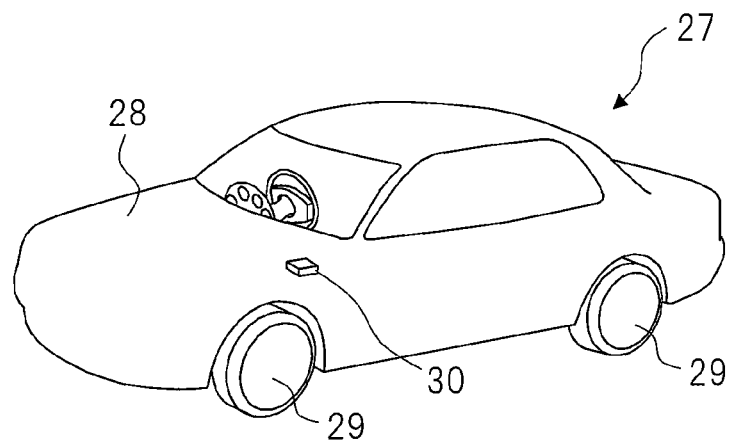
FIG. 9 is a perspective view illustrating an example of an automobile in which the semiconductor device illustrated in FIG. 1 is mounted.

Next, a description will be made of an automobile in which the power module 20 of the first or second embodiment is mounted. FIG. 9 is a perspective view illustrating an example of an automobile in which the semiconductor device illustrated in FIG. 1 is mounted.

An automobile 27 illustrated in FIG. 9 mounts, for example, the power module 20 illustrated in FIG. 1, and includes: a body 28; tires 29; the power module 20 of FIG. 1; and a mounting unit 30 that is a mounting member for supporting the power module 20.

In the automobile 27, the power module 20 is mounted on an inverter included in the mounting unit 30. The mounting unit 30 is, for example, an engine control unit, and if so, the mounting unit 30 is disposed near the engine. In this case, the mounting unit 30 is used under the high temperature environment and, thus, the power module 20 is also in a state of high temperature.

However, provided in the automobile 27 is the inverter on which the plurality of power modules 20 each using the bonding structure of the module illustrated in FIG. 1 are mounted. Therefore, reliability of the automobile 27 can be enhanced even when the mounting unit 30 is in the high temperature environment. That is, also in the automobile 27, it is possible to achieve the power module 20 and an inverter system using the power module 20 that have the operative stability under the high temperature environment and that can endure the large current load.

In the foregoing, the invention made by the inventors of the present invention has been concretely described based on the embodiments. However, it is needless to say that the present invention is not limited to the foregoing embodiments and various modifications and alterations can be made within the scope of the present invention.

Incidentally, the present invention is not limited to the embodiments described above, and includes various modifications. For example, the embodiments described above have been described in detail in order to explain the present invention easily, and are not necessarily limited to those having all the configurations described.

In addition, a part of the configuration of one embodiment can be replaced by the configuration of another embodiment, and the configuration of one embodiment can be added to the configuration of another embodiment. In addition, to a part of the configuration of each embodiment, it is possible to add, delete, and replace the configuration of another embodiment. Incidentally, each member and the relative size described in the drawings are simplified and idealized in order to explain the present invention easily, and become more complicated shape in implementation.

In addition, as described in the second embodiment, the side face 3f of the metal wiring 3a is sufficient to have at least the first region 3g in which the plating film 3ga as a partial plating is formed, and the second region 3h as a non-plating region formed at an upper position of the first region 3g, and does not necessarily include the third region 3i that is illustrated in FIG. 2 and in which the metal uneven part is formed.

In addition, on the side face 3f of the metal wiring 3a, the resin forming the resin part 11 may be bonded or not bonded to the non-plating region (second region 3h) positioned above the plating film 3ga.

In addition, on the plurality of metal wirings 3a provided on the principal surface 3d of the ceramic substrate 3, all of their side faces 3f do not have to include the first region 3g and the second region 3h. But, all of the side faces 3f of the plurality of metal wirings 3a preferably include at least the first region 3g and the second region 3h.

What is claimed is:

1. A semiconductor device comprising:
    an insulating substrate that has a first surface and a second surface positioned opposite to the first surface, and is provided with a plurality of wiring parts on the first surface;
    a semiconductor chip mounted on any of the plurality of wiring parts; and
    a resin part disposed around each of the plurality of wiring parts,
    wherein a side face of any of the plurality of wiring parts includes a first region in which a plating film is formed, a second region that is positioned in a direction away from the first surface of the insulating substrate from the first region and in which the plating film is not formed, and a third region having a metal uneven part with unevenness made of metal between the first region and the second region; and the resin part is bonded to the metal uneven part, the plating film and the first surface of the insulating substrate.

2. The semiconductor device according to claim 1, wherein the first region has a larger area than the third region.

3. The semiconductor device according to claim 1, wherein the metal uneven part is an uneven part formed of metal particles.

4. The semiconductor device according to claim 1, wherein the metal uneven part is made of a porous metal film.

5. The semiconductor device according to claim 1, wherein the plating film is in contact with the first surface of the insulating substrate.

6. The semiconductor device according to claim 1, wherein the insulating substrate is a ceramic substrate.

7. The semiconductor device according to claim 6, wherein each of the wiring parts contain Cu, and the plating film is a Ni-based plating film.

8. The semiconductor device according to claim 1, wherein side faces of all of the plurality of wiring parts each include the first region and the second region.

9. The semiconductor device according to claim 1, wherein a resin forming the resin part is a polyamide-imide-based resin.

10. The semiconductor device according to claim 1, wherein the semiconductor device is mounted on an inverter provided in a railroad vehicle.

11. The semiconductor device according to claim 1, wherein the semiconductor device is mounted on an inverter provided in a body of an automobile.

12. A semiconductor device comprising:
a semiconductor chip mounted on any of a plurality of wiring parts;
an insulating substrate that has a first surface and a second surface positioned opposite to the first surface, and is provided with the plurality of wiring parts on the first surface, wherein the insulating substrate is mounted on a metal plate via solder; and
a resin part disposed around each of the plurality of wiring parts, wherein a side face of any of the plurality of wiring parts includes a first region in which a plating film is formed, a second region that is positioned in a direction away from the first surface of the insulating substrate from the first region and in which the plating film is not formed, and a third region having a metal uneven part with unevenness made of metal between the first region and the second region;
wherein the metal plate is one of a Cu plate, an AlSiC plate and a MgSiC plate having a Ni-based plating film at a bonding position to the solder, and the metal uneven part is an uneven part made of Ni particles.

13. The semiconductor device according to claim 12, wherein the first region has a larger area than the third region.

14. The semiconductor device according to claim 12, wherein the metal uneven part is an uneven part formed of metal particles.

15. The semiconductor device according to claim 12, wherein the metal uneven part is made of a porous metal film.

16. The semiconductor device according to claim 12, wherein the plating film is in contact with the first surface of the insulating substrate.

17. The semiconductor device according to claim 12, wherein the insulating substrate is a ceramic substrate.

18. The semiconductor device according to claim 17, wherein each of the wiring parts contain Cu, and the plating film is a Ni-based plating film.

19. The semiconductor device according to claim 12, wherein side faces of all of the plurality of wiring parts each include the first region and the second region.

20. The semiconductor device according to claim 12, wherein a resin forming the resin part is a polyamide-imide-based resin.

* * * * *